(12) United States Patent
Frougier et al.

(10) Patent No.: US 12,382,662 B2
(45) Date of Patent: Aug. 5, 2025

(54) WRAP-AROUND-CONTACT FOR 2D-CHANNEL GATE-ALL-AROUND FIELD-EFFECT-TRANSISTORS

(71) Applicant: International Business Machines Corporation, Armonk, NY (US)

(72) Inventors: Julien Frougier, Albany, NY (US); Ruilong Xie, Niskayuna, NY (US); Kangguo Cheng, Schenectady, NY (US); Chanro Park, Clifton Park, NY (US); Andrew Gaul, Halfmoon, NY (US)

(73) Assignee: International Business Machines Corporation, Armonk, NY (US)

( * ) Notice: Subject to any disclaimer, the term of this patent is extended or adjusted under 35 U.S.C. 154(b) by 654 days.

(21) Appl. No.: 17/538,205

(22) Filed: Nov. 30, 2021

(65) Prior Publication Data

US 2023/0170396 A1   Jun. 1, 2023

(51) Int. Cl.
  *H01L 27/088* (2006.01)
  *H10D 30/67* (2025.01)
  (Continued)

(52) U.S. Cl.
  CPC ..... *H10D 30/6735* (2025.01); *H10D 30/6757* (2025.01); *H10D 62/121* (2025.01); *H10D 99/00* (2025.01)

(58) Field of Classification Search
  CPC ........... H01L 29/42392; H01L 29/0673; H01L 29/66969; H01L 29/78696; H01L 29/0847;
  (Continued)

(56) References Cited

U.S. PATENT DOCUMENTS

| 4,262,296 A | 4/1981 | Shealy et al. |
|---|---|---|
| 6,838,721 B2 | 1/2005 | Garni et al. |

(Continued)

FOREIGN PATENT DOCUMENTS

| CN | 105470001 A | 4/2016 |
|---|---|---|
| CN | 107039515 A | 8/2017 |

(Continued)

OTHER PUBLICATIONS

List of IBM Patents or Patent Applications Treated as Related, for U.S. Appl. No. 17/538,205, filed Nov. 30, 2021.

(Continued)

*Primary Examiner* — Niki H Nguyen
(74) *Attorney, Agent, or Firm* — Patterson + Sheridan, LLP

(57) ABSTRACT

Embodiments herein describe FETs with channels connected on the sides to a metal liner. To avoid the difficulties of connecting the sides of the channels to metal liners for the drain and source regions, the embodiments herein form a male/female contact between the channels and the metal liners. In one embodiment, instead of exposing only the end or side surfaces of the channels, an end knob of the channel is exposed. This knob can include the side surface as well as a portion of the top, bottom, front, and back sides of the channel. As such, when the metal liner is deposited on the knob, this metal forms an electrical connection on all sides of the knob. This male/female connection provides a more reliable and lower resistance connection between the channel and the metal liner than using only the end or side surfaces of the channel.

17 Claims, 14 Drawing Sheets

(51) Int. Cl.
*H10D 62/10* (2025.01)
*H10D 99/00* (2025.01)

(58) Field of Classification Search
CPC . H01L 29/7848; H01L 29/165; H01L 27/092;
H01L 27/088; H01L 21/823412; H01L
21/76897; H01L 21/823807; H01L
29/401; H01L 21/823821; H01L
2029/7858; H01L 29/1033; H01L
23/5226; H01L 21/823456; H01L
27/0922; H01L 29/41725; H01L 21/845;
H01L 27/1211; H01L 21/823462; H01L
21/8221; H01L 21/823468; H01L
29/1054; H01L 29/66818; H01L
21/82385; H01L 21/02603; H01L
29/66787; H01L 29/0669; H01L 25/0657;
H01L 29/1606; H01L 29/4908; H01L
21/02606; H01L 29/66045; H01L
29/42316; H01L 2924/1306; H01L
25/0756

See application file for complete search history.

(56) References Cited

U.S. PATENT DOCUMENTS

| | | | |
|---|---|---|---|
| 8,471,249 | B2 | 6/2013 | Chiu et al. |
| 8,679,902 | B1 | 3/2014 | Basker et al. |
| 8,742,511 | B2 | 6/2014 | Chang et al. |
| 8,916,914 | B2 | 12/2014 | Kim et al. |
| 9,349,806 | B2 | 5/2016 | Ho et al. |
| 9,490,323 | B2 | 11/2016 | Rodder et al. |
| 9,508,801 | B2 | 11/2016 | Franklin et al. |
| 9,548,394 | B2 | 1/2017 | Das et al. |
| 9,553,199 | B2 | 1/2017 | Hou et al. |
| 9,748,352 | B2 | 8/2017 | Liu et al. |
| 9,812,449 | B2 | 11/2017 | Obradovic et al. |
| 9,853,053 | B2 | 12/2017 | Lupino et al. |
| 10,134,915 | B2 | 11/2018 | Colinge et al. |
| 10,283,603 | B2 | 5/2019 | Yang |
| 10,388,732 | B1 | 8/2019 | Frougier et al. |
| 10,804,398 | B2 | 10/2020 | Frougier et al. |
| 10,818,803 | B1 | 10/2020 | Frougier et al. |
| 11,127,859 | B2 | 9/2021 | Tsai |
| 11,482,538 | B2 | 10/2022 | Liu et al. |
| 11,935,930 | B2 | 3/2024 | Frougier et al. |
| 2010/0213538 | A1 | 8/2010 | Fukuzumi et al. |
| 2012/0138887 | A1 | 6/2012 | Zhang et al. |
| 2012/0273763 | A1 | 11/2012 | Banerjee et al. |
| 2017/0317206 | A1 | 11/2017 | van Dal et al. |
| 2018/0182898 | A1 | 6/2018 | Moroz et al. |
| 2019/0067326 | A1 | 2/2019 | Huang et al. |
| 2019/0067475 | A1 | 2/2019 | Liu et al. |
| 2019/0386145 | A1 | 12/2019 | Ok et al. |
| 2020/0219997 | A1 | 7/2020 | Mehandru et al. |
| 2020/0266060 | A1* | 8/2020 | Cheng ............ H10D 62/116 |
| 2020/0388713 | A1 | 12/2020 | Tsai |
| 2021/0098294 | A1 | 4/2021 | Smith et al. |
| 2021/0135015 | A1 | 5/2021 | Frougier |

FOREIGN PATENT DOCUMENTS

| | | |
|---|---|---|
| CN | 113206091 A | 8/2021 |
| CN | 114613850 A | 6/2022 |
| DE | 112022004586 T5 | 7/2024 |
| EP | 3255656 A1 | 12/2017 |
| EP | 3608965 A1 | 2/2020 |
| GB | 2627400 A | 8/2024 |
| WO | 2011160922 A1 | 12/2011 |
| WO | 2023/098502 A1 | 6/2023 |

OTHER PUBLICATIONS

Manuel Mencarelli, "Investigation of low temperature SiGe epitaxy with high order precursors," IMEC, dated Apr. 2021, pp. 1-73.

PCT, Notification of Transmittal of the International Search Report and the Written Opinion of the International Searching Authority, or the Declaration for Application PCT/CN2022/133196 dated Feb. 15, 2023.

Chen et al. "Stable few-layer MoS2 rectifying diodes formed by plasma-assisted doping", Applied Physics Letter, Oct. 3, 2013, 5 pages.

Chou et al. "High On-Current 2D nFET of 390 mA/mm at VDS = 1V using Monolayer CVD MoS2 without Intentional Doping", 2020 IEEE Symposium on VLSI Technology, Jun. 2020, 2 pages.

Ebrahimi et al. "Monolithic 3D integration advances and challenges: From technology to system levels", 2014 SOI-3D-Subthreshold Microelectronics Technology Unified Conference (S3S), Oct. 2014, 2 pages.

Jagannathan et al. "Vertical-Transport Nanosheet Technology for CMOS Scaling beyond Lateral-Transport Devices", 2021 IEEE International Electron Devices Meeting (IEDM), Dec. 2021, 4 pages.

Mo et al. "Experimental Demonstration of Ferroelectric HfO2 FET with Ultrathin-body IGZO for High-Density and Low- Power Memory Application", 2019 Symposium on VLSI Technology, Jun. 2019, 2 pages.

Nipane et al. "Few-Layer MoS2p-Type Devices Enabled by Selective Doping Using Low Energy Phosphorus Implantation", ACS publications, Jan. 20, 2016, 10 pages, vol. 10, Issue 2.

Oota et al. "3D-Stacked CAAC—In—Ga—Zn Oxide FETs with Gate Length of 72nm", 2019 IEEE International Electron Devices Meeting (IEDM), Dec. 2019, 4 pages.

Shengman et al. "Nanometre-thin indium tin oxide for advanced high-performance electronics", Nature Materials, Oct. 2019, pp. 1091-1097.

Wi et al. "Enhancement of photovoltaic response in multilayer MoS2 induced by plasma doping", ACS Nano, May 27, 2014, pp. 5270-5281, vol. 8, No. 5.

\* cited by examiner

WRAP-AROUND-CONTACT FOR 2D-CHANNEL GATE-ALL-AROUND FIELD-EFFECT-TRANSISTORS

BACKGROUND

The present invention relates to female and male contacts between channel and metal liners in a field-effect transistor (FET).

Currently, a stacked 2D-channel horizontal-transport Gate-All-Around FET (h-GAA FET) includes multiple channels arranged in a stack. To electrically connect the channel to drain and source regions, a metal liner is disposed on the ends (or sides) of the channels. However, these channels may be very thin which makes forming a suitable electrical connection between the metal liners and the sides of channels difficult.

SUMMARY

One embodiment of the present invention is a FET that includes a channel, a gate separated from the channel by at least one dielectric layer where the dielectric layer has a smaller width than the channel such that the ends of the channel form knobs that extend width-wise further than the ends of the dielectric layer, and a conductive liner that includes female portions that contact the knobs of the channel where the knobs are male portions that form female/male electrical connections with the female portions of the conductive liner.

Another embodiment of the present invention is a FET that includes a plurality of stacked channels, a gate disposed on multiple sides of each of the plurality of stacked channels, and a conductive liner forming female/male connections with ends of each of the plurality of stacked channels.

Another embodiment of the present invention is a method that includes forming a channel for a FET, recessing at least two dielectric layers disposed on opposite sides of the channel to form knobs at the ends of the channel, and depositing a conductive liner on the knobs such that the conductive liner and the knobs form female/male electrical connections.

DETAILED DESCRIPTION

Embodiments herein describe FETs with channels connected on the sides to a metal liner in order to connect the channels to the drain and source regions. To avoid the difficulties of connecting the sides of the channels to metal liners, the embodiments herein form a male/female contact between the channels and the metal liners. In one embodiment, instead of exposing only the end or side surfaces of the channels, an end knob of the channel is exposed. This knob can include the side surface as well as a portion of the top, bottom, front, and back sides of the channel. As such, when the metal liner is deposited on the knob, this metal forms an electrical connection on multiple sides of the knob. Thus, the knob serves as a male portion of the channel that is covered by a female portion of the metal liner. This male/female connection provides a more reliable and lower resistance connection between the channel and the metal liner than compared to using only the end or side surfaces of the channel.

While the embodiments herein describe using the ends of the channel as the male portion of the female/male connection, in other embodiments the process can be modified so that the channel forms a female portion while the metal liner forms the male portion.

Figure 1:
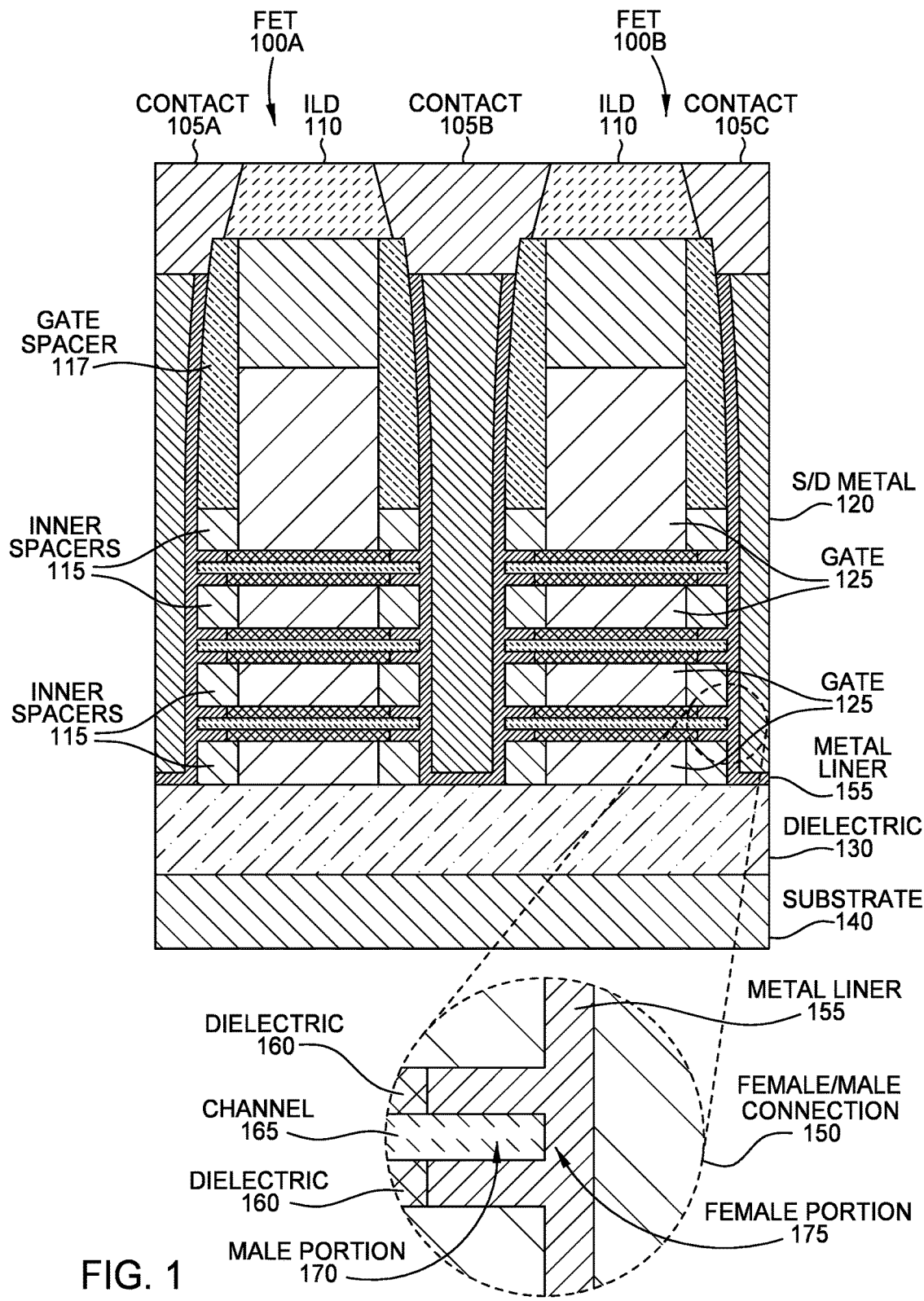
FIG. 1 illustrates h-GAA FETs with female/male connections between channel and metal liners, according to one embodiment.

FIG. 1 illustrates h-GAA FETs 100 with female/male connections between channel and metal liners, according to one embodiment. That is, FIG. 1 illustrates FETs 100A and 100B disposed side-by-side in, e.g., an integrated circuit. In this example, the FETs 100 share a contact 105B which is connected to a shared drain or source region (not shown).

Starting from the top, the FETs 100 include the contacts 105A-C that connect to source and drain regions. For example, the contacts 105A and 105C can connect to respective drain regions while the contact 105B connects to a shared source region, or the contacts 105A and 105C can connect to respective source regions while the contact 105B connects to a shared drain region.

An inter-layer dielectric (ILD) 110 is disposed at the top of the FETs 100. Caps (which will be discussed later) separate the ILD 110 from underlying gates 125 (e.g., a gate metal). Moreover, each FET 100 includes multiple channels 165 that are arranged vertically on top of each other. That is, the channels 165 are horizontal channels (parallel with a substrate 140) that result in the FETs 100 being horizontal-transport devices.

The channels 165 are insulated from the gate 125 by high-k dielectric layers 160. While these layers 160 are shown above and below the channels 165, the high-k dielectric material can also cover the front and back sides (relative to the direction into and out of the page) to insulate the channels 165 from the gate 125 which can also wrap around the channel 165. The inner spacers 115 are an insulative material that sets the spacing between each of the channels 165. Gate spacers 117 are disposed on top of the inner spacers 115.

The ends of the channels 165 (i.e., the left and right sides of the channels 165) are electrically connected to a metal liner 155 (e.g., a conductive material). The metal liner 155 forms an electrical connection between the channel 165 and a source/drain (S/D) metal 120. The S/D metal 120 is in turn connected to the contacts 105. While the embodiments herein recite a metal liner 155, the embodiments are not limited to such and can be used with any conductive liner, whether made of metal or some other conductive material.

The electrical connection between the ends of the channel 165 and the metal liner 155 is an important feature to the performance of the FETs 100. A poor electrical connection can degrade the operation of the FET 100. However, ensuring a good electrical connection has become difficult as transistors have shrunk. Transistors down-sizing is arriving at fundamental and practical limits. One technology direction with the largest potential for progress is the integration of transistors in the 3rd dimension on top of each other, like the h-GAA FETs 100. Monolithic 3D integration can offer cost-effective, large-scale implementation of nanoelectronic systems. It offers the largest gains in transistors-per-chip, it solves the on-chip interconnect and communication gridlock and thus energy, speed, and bandwidth problems.

Part of reducing the size of the FETs is using thinner channels. Nanosheet is the lead device architecture for continuing CMOS scaling. However just like other MOSFET technology, it is based on crystalline Si integration. This requirement can quickly become a limiting factor for monolithic 3D integration. One way to enable sub-40CPP (Contacted-Poly-Pitch) is to scale the gate length below the current demonstrated limit of 12 nm effective. Reducing the Si sheet thickness below 5 nm to improve electrostatic control is difficult, if not impossible, since quantum confinement effects start to degrade performances. However, the use of 2D materials as the channel 165 can permit ultra-thin channels (e.g., less than 5 nm). 2D materials can include monolayer, bi-layer, and tri-layer 2D-material such as transition metal dichalcogenide material such as MoS2, MoSe2, MoTe2, HfS2, ZrS2, WS2, WSe2, SnS, or hexagonal boron nitride h-BN, or at least one oxide-semiconductor such as ITO, ZnO, IGZO, InGaZnO, InAlZnO, or Graphene or carbon nanotubes. However, formation of lateral contact of 2D materials is still not established due to the ultra-thin thickness of the material when used as the channel 165.

FIG. 1 illustrates a female/male connection 150 to support the ultra-thin thickness of a channel 165 formed from 2D materials. While the embodiments herein discuss using the female/male connection 150 on an ultra-thin channel 165 (e.g., 0.5-5 nm), it can also be used on thicker channels 165 (e.g., 5-50 nm) which may be formed from other materials besides a 2D material, such as a traditional Si channel. Put differently, the female/male connection 150 can provide an improved electrical connection regardless of the thickness of the channel 165. Further, the embodiments herein can be used on any material that permits an ultra-thin channel 165, whether the channel 165 is made from 2D material or some other material. For example, a 1D material can be used to form an ultra-thin channel 165 such as carbon nanotubes.

As shown in the blow-out image in FIG. 1, the female/male connection 150 is formed from a portion of the channel 165 that establishes a male portion 170 while a portion of the metal liner 155 forms a female portion 175. In this example, the female portion 175 wraps around the male portion 170, and thus, the female/male connection 150 can also be referred to as a wrap-around connection. The female portion 175 of the metal liner 155 contacts the top and bottom and left sides of the male portion 170 portion of the channel 165. Although not shown in FIG. 1, in other implementations, the metal liner 155 may also contact the front and back sides of the male portion 170. The female/male connection 150 provides an improved electrical connection between the channel 165 and the metal liner 155 relative to only connecting the metal liner to the right side of the channel 165. For instance, the female/male connection 150 increases the effective contact area between the channel 165 and the Source-Drain region via the conductive, metal liner 155.

While three channels 165 are shown in each FET 100, the FETs 100 can include any number of channels (e.g., more than three or less than three). These channels 165 are disposed on a dielectric layer 130 (e.g., an inter-layer dielectric) which is in turn disposed on the substrate 140 (e.g., an underlying integrated structure which can include metal layers and other electrical structures).

Figure 2A:
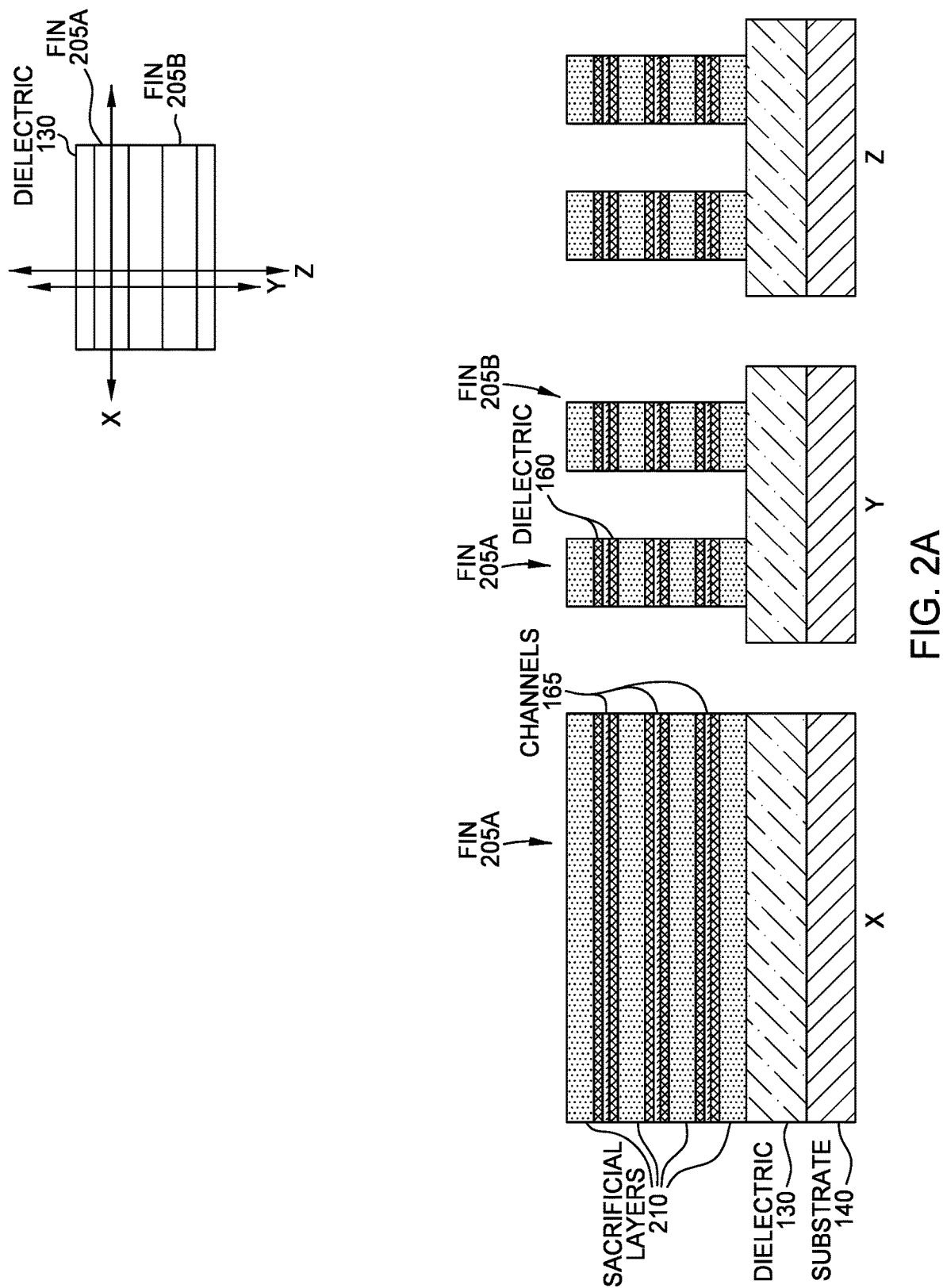
FIGS. 2A-2J illustrate forming h-GAA FETs with female/male connections between channel and metal liners, according to embodiments.

FIGS. 2A-2J illustrate forming h-GAA FETs with female/male connections between channel and metal liners, according to embodiments. FIG. 2A illustrates two fins 205A and 205B that have been formed on the dielectric layer 130 and the substrate 140. For ease of explanation, FIGS. 2A-2J illustrates cross sections along the axes labeled X, Y, and Z. The location of the axes are shown in the top view in FIG. 2A (and selected other figures).

The three channels 165 and their corresponding dielectric layers 160 have been formed on top of respective sacrificial layers 210. These sacrificial layers 210 set the spacing between the channels 165, but as the name implies, will be removed in later processing steps. In one embodiment, the sacrificial layers 210 are formed using amorphous SiGe (a-SiGe) but is not limited to such. The layers 160 can be any high-k dielectric (e.g., HfO2).

In one embodiment, the channel 165 has a thickness greater than 5 nm (e.g., 5-50 nm) and can be formed for any suitable material. In another embodiment, the channel 165 has a thickness less than 5 nm (e.g., 1-5 nm or 0.5-4 nm) and is formed from a 2D material (e.g., transition metal dichalcogenide material such as MoS2, MoSe2, MoTe2, HfS2, ZrS2, WS2, WSe2, SnS, or hexagonal boron nitride h-BN, or at least one oxide-semiconductor such as ITO, ZnO, IGZO, InGaZnO, InAlZnO, or Graphene) or a 1D material (e.g., carbon nanotubes). In one embodiment, the thickness of the sacrificial layers 210 is around 8.5 nm (e.g., 5-15 nm) and the thickness of the dielectric layers 160 is between 1-4 nm or between 1.5-2 nm.

In one embodiment, planar or bulk deposition processes can be used to form the sacrificial layers 210, the high-k dielectric layer 160, and the channels 165. A mask can then be used to etch through these layers to form the fins 205A and 205B shown in FIG. 2A.

Figure 2B:
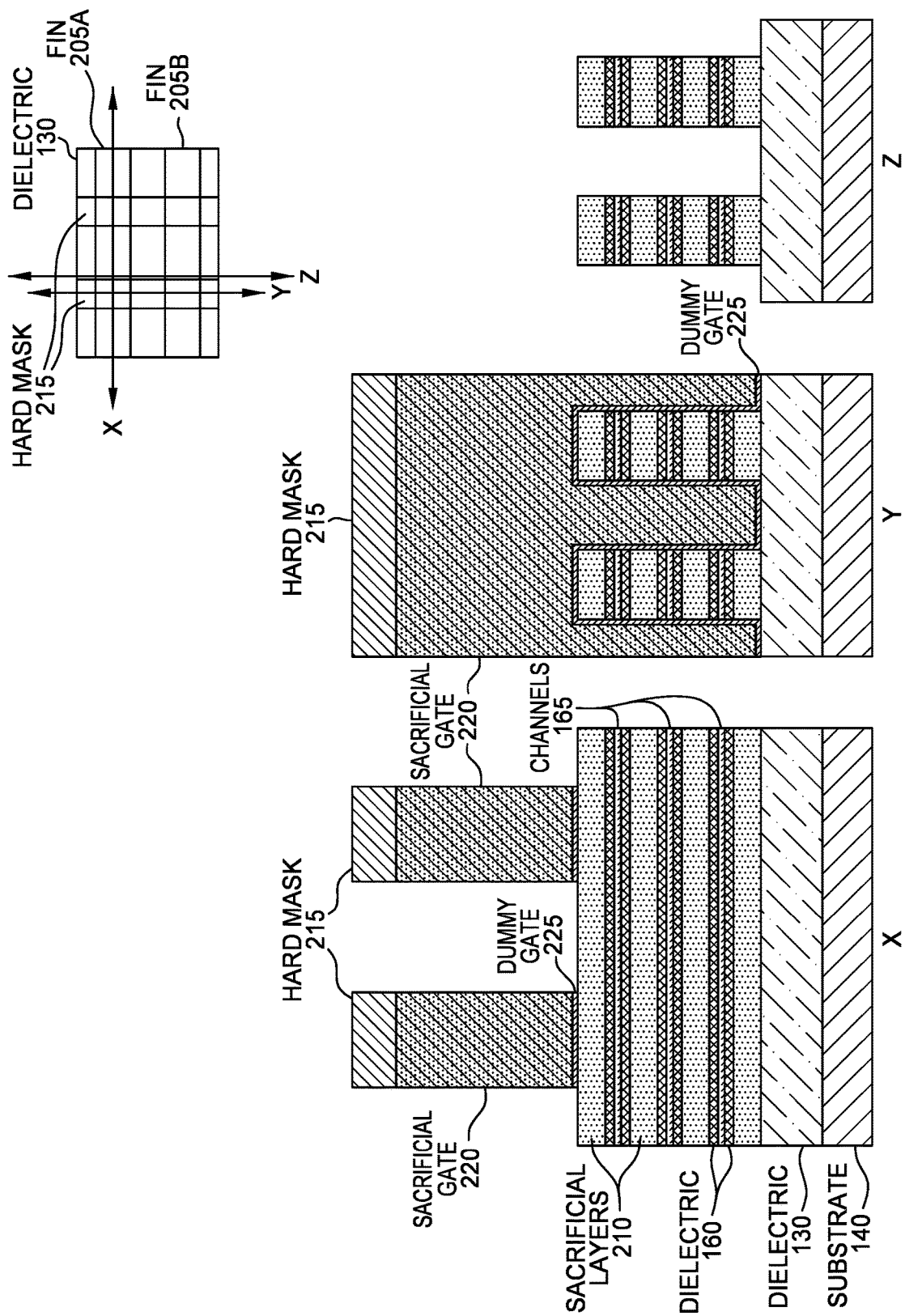

FIG. 2B illustrates patterning and forming a dummy gate dielectric 225, sacrificial gate 220, and a hard mask 215 on the topmost sacrificial layer 210. As shown by the top view, the dummy gate dielectric 225, sacrificial gate 220, and a hard mask 215 extend in a direction that is perpendicular to the fins 205. These layers will be removed in later processing steps and backfilled with the gate material.

In one embodiment, the hard mask 215 is formed from a dielectric, such as an oxide. In one embodiment, the dummy gate 220 is amorphous Si (a-Si).

Figure 2C:
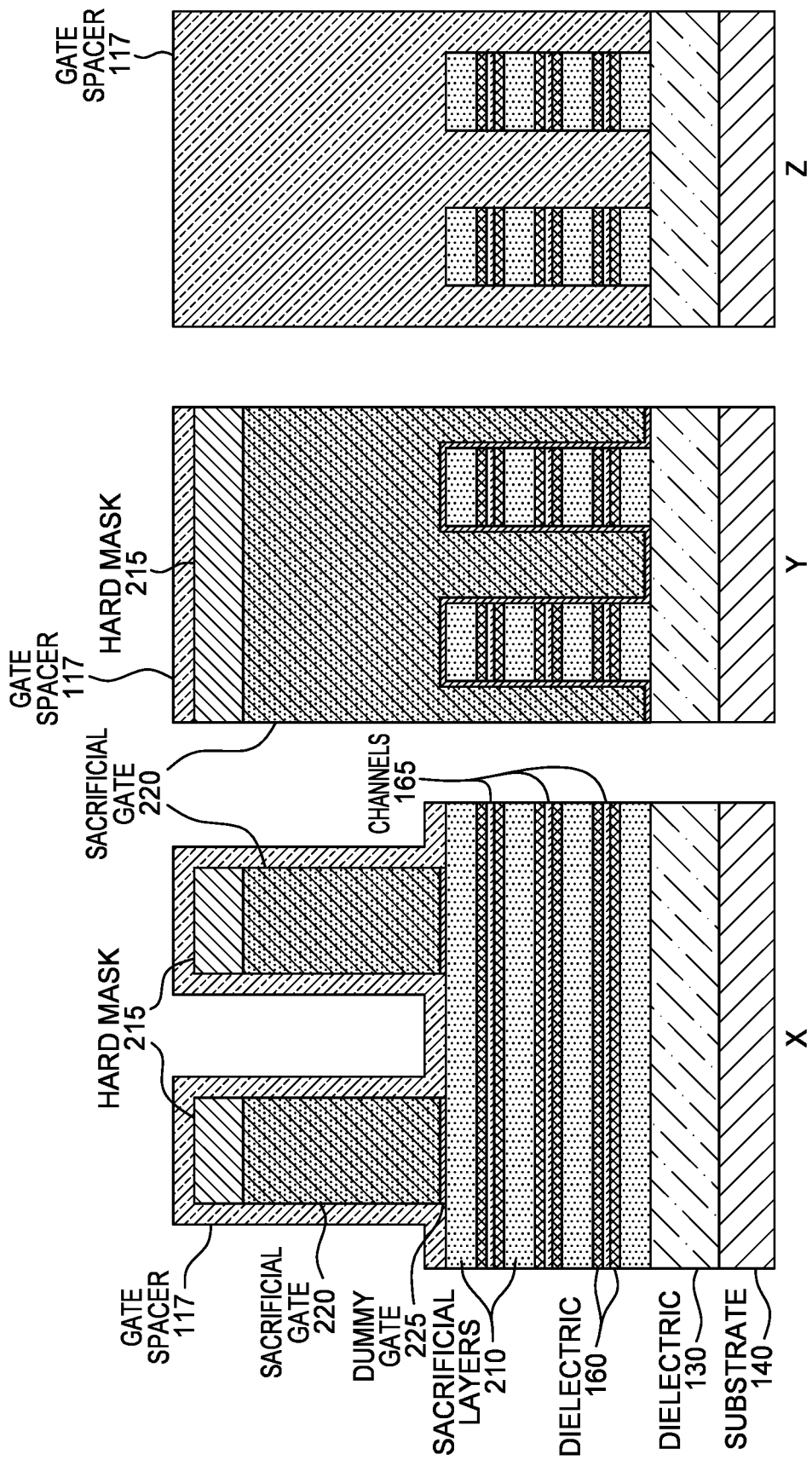

FIG. 2C illustrates conformally covering the entire structure shown in FIG. 2B with a gate spacer 117. In one embodiment, the gate spacer 117 is low-k material such as SiBCN, SiOC, SiOCN, or SiON.

Figure 2D:
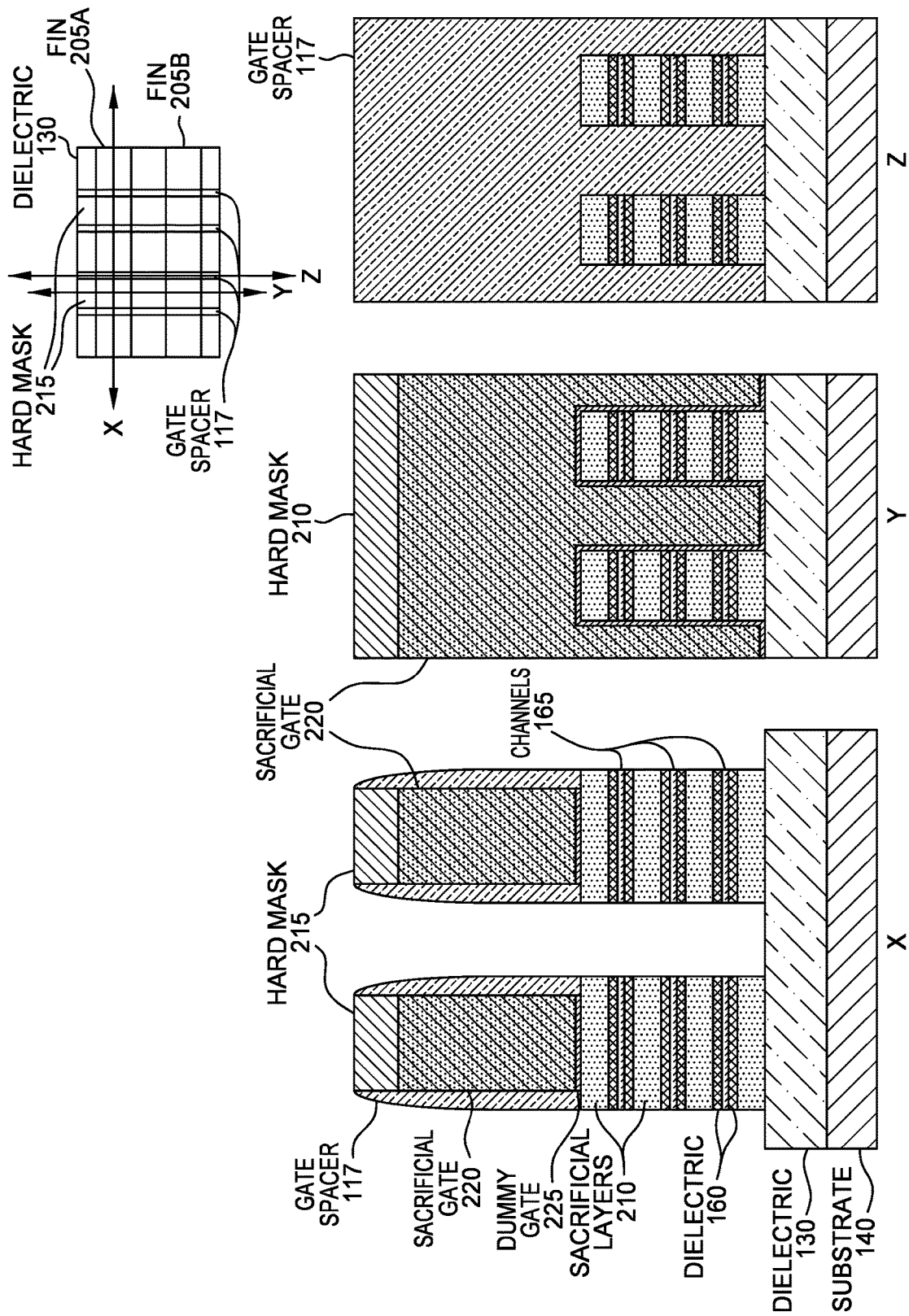

FIG. 2D illustrates selectively removing or etching the gate spacer 117 so that the spacer 117 is only disposed along the side walls of the structure (a fin) formed by the dummy gate dielectric 225, the sacrificial gate 220, and the hard mask 215. This is primarily shown by the cross section corresponding to the Z axis.

Forming the gate spacer 117 along the sides of the dummy gate dielectric 225, the sacrificial gate 220, and the hard mask 215 permits the gate spacer 117 to define a cavity for depositing the gate metal once these layers have been removed. The self-align formation of this cavity can be obtained by using directional RIE self-aligned to the gate dielectric 225 and gate spacers 117.

Figure 2E:
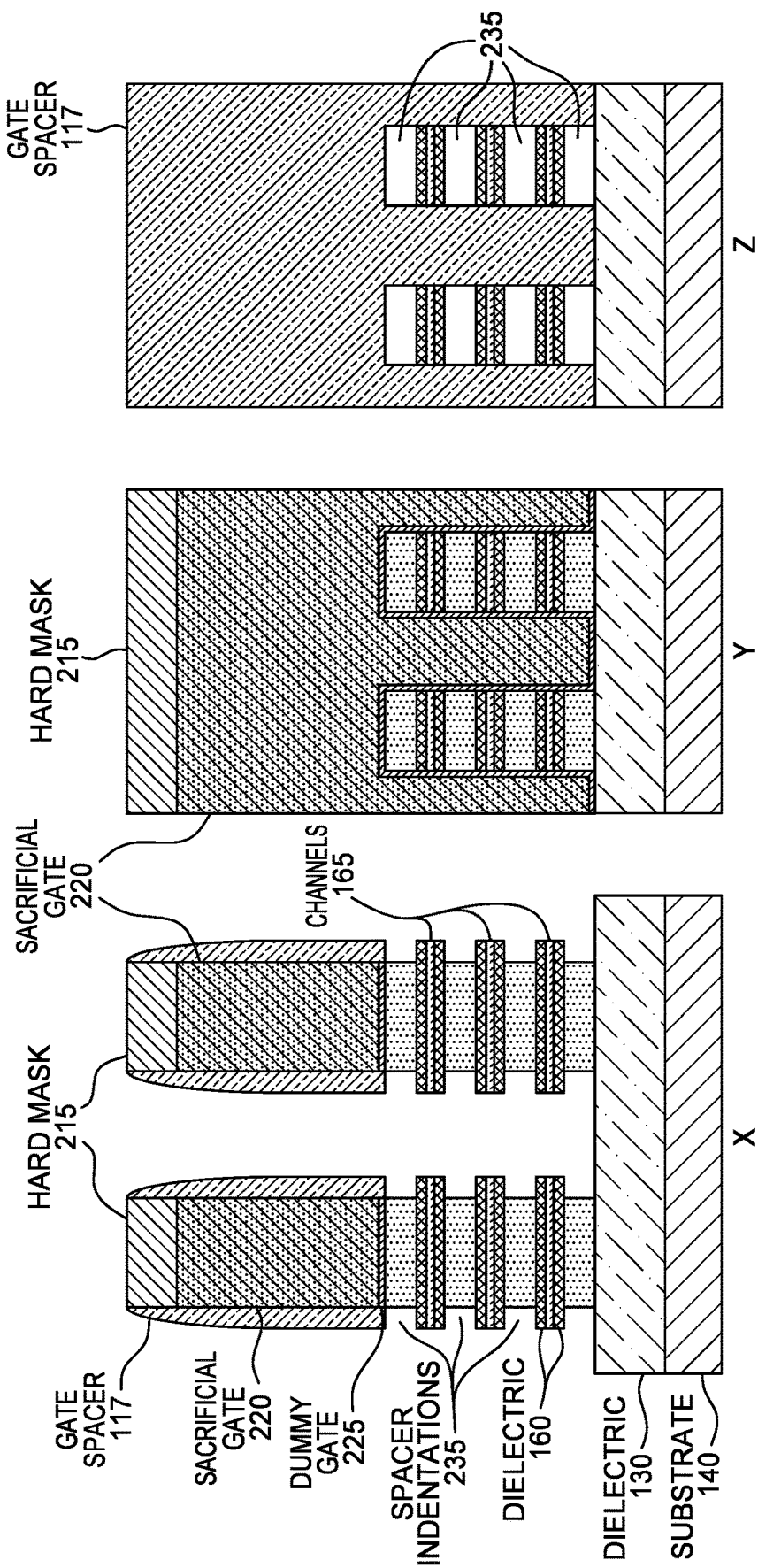

FIG. 2E illustrates using a selective etch to remove a portion of the sacrificial layers 210. Doing so creates spacer indentations 235. In one embodiment, a precise, timed etch is used to form the spacer indentations 235. In one embodiment, the etch is timed so the new locations of the sides of the sacrificial layers 210 substantially align (e.g., within a few nanometers) with the sides of the dummy gate dielectric 225 and the sacrificial gate 220. In one embodiment, a vapor phase HCl or ClF3 process is used to etch the sacrificial layers 210.

Figure 2F:
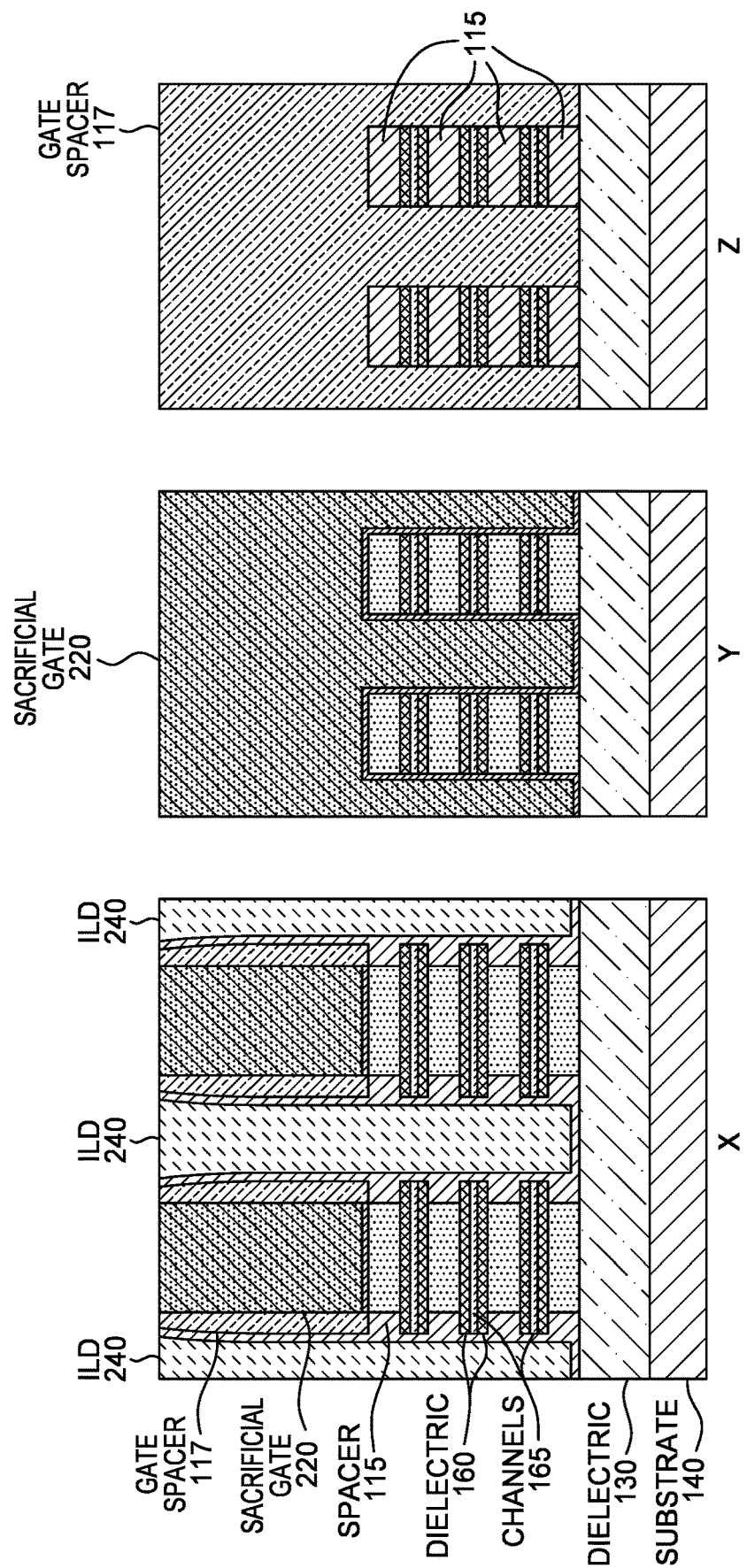

FIG. 2F illustrates conformally depositing the spacer 115 on the structure shown in FIG. 2E. Notably the spacer 115 is deposited in the spacer indentations 235. As discussed in more detail below, the spacer 115 provides support to the dielectric layers 160 and the channels 165 once the remaining portions of the sacrificial layers 210 are removed.

After depositing the spacer 115, an ILD 240 (e.g., $SiO_2$) is conformally deposited on the spacer 115. The ILD 240 provides additional structural support to the fins during the subsequent processing steps.

After depositing the ILD 240, the structure is planarized using, e.g., chemical-mechanical polishing. Doing so removes the hard mask and exposes the sacrificial gate 220.

Figure 2G:
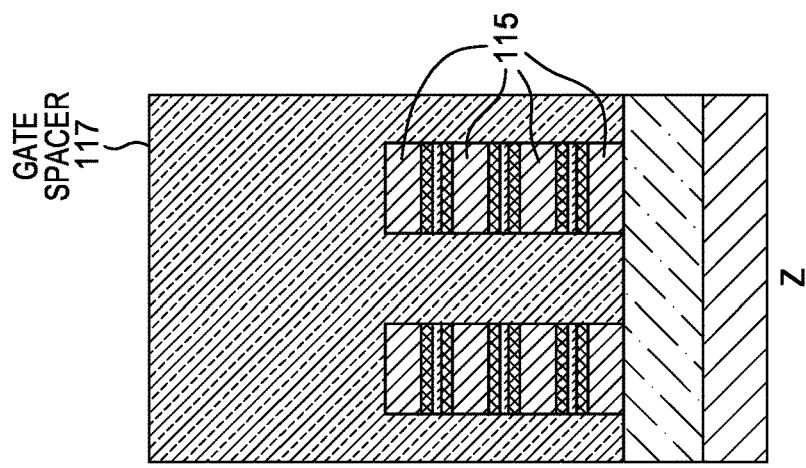
Figure 2G:
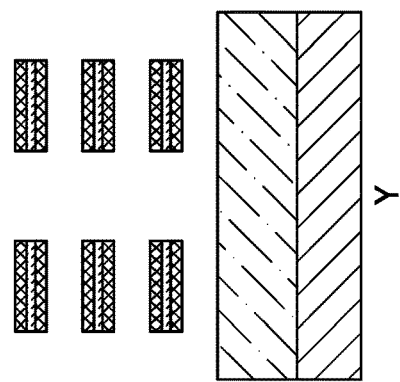
Figure 2G:
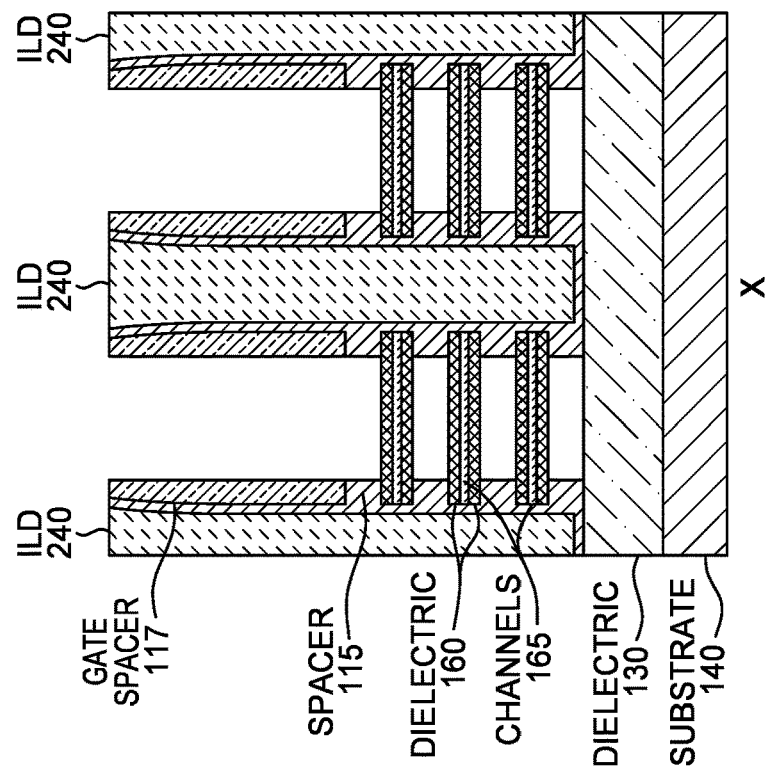

FIG. 2G illustrates performing a selective etch to remove the sacrificial gate 220, dummy gate dielectric 225, and the sacrificial layers 210 between the channels 165. As a result, the dielectric layers 160 and the channels 165 are suspended within the fins by the spacer 115. The top and bottom dielectric layers 160 also provide structural support to channels 165 during this etching process (also referred to as a channel release) to prevent bending or rupturing the material of the channel 165 (e.g., 2D or 1D material).

Figure 2H:
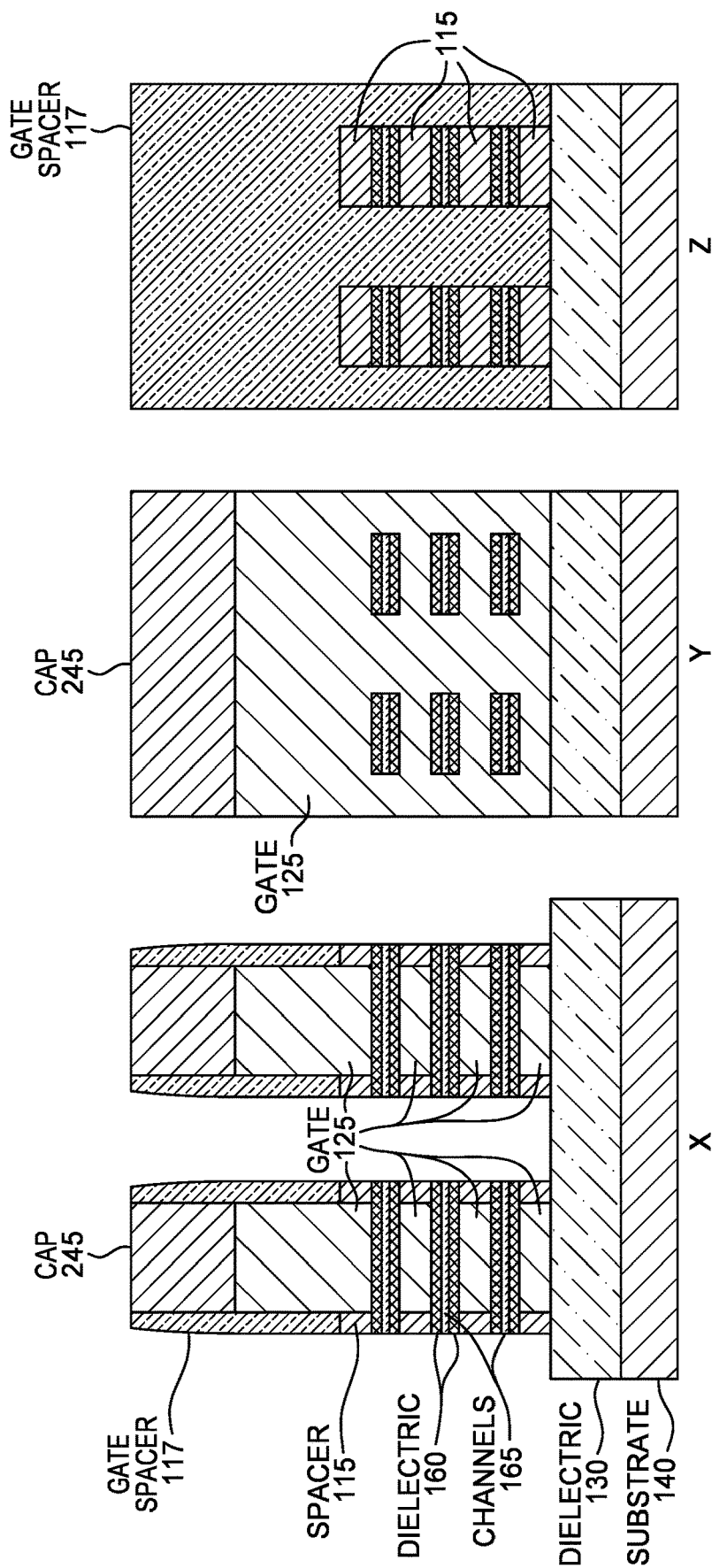

FIG. 2H illustrates backfilling the voids left by the sacrificial gate 220, dummy gate dielectric 225, and the sacrificial layers 210 with the material of the gate 125 (e.g., a gate metal). Moreover, a cap 245 is formed on top of the gate 125 in each of the fins. In one embodiment, the cap 245 is a self-aligning contact (SAC) that provides selectivity to enable the source or drain to be aligned to the spacer 115 in subsequent steps.

Further, FIG. 2H illustrates removing the ILD 240, which may be performed after forming the gate 125 and the cap 245. In addition to remove the ILD 240, the spacer 115 can also be etched to expose the sides (i.e., the left and right ends) of the dielectric layers 160 and the channels 165.

Further, the Y axis view in FIG. 2H illustrates the sides of the channels 165 directly contacting the gate 125 which can cause a short. Although not shown in these figures, in a previous processing step (e.g., in FIG. 2G), a thin gate dielectric can be disposed to cover the sides of the channels 165 before depositing the metal of the gate 125.

Figure 2I:
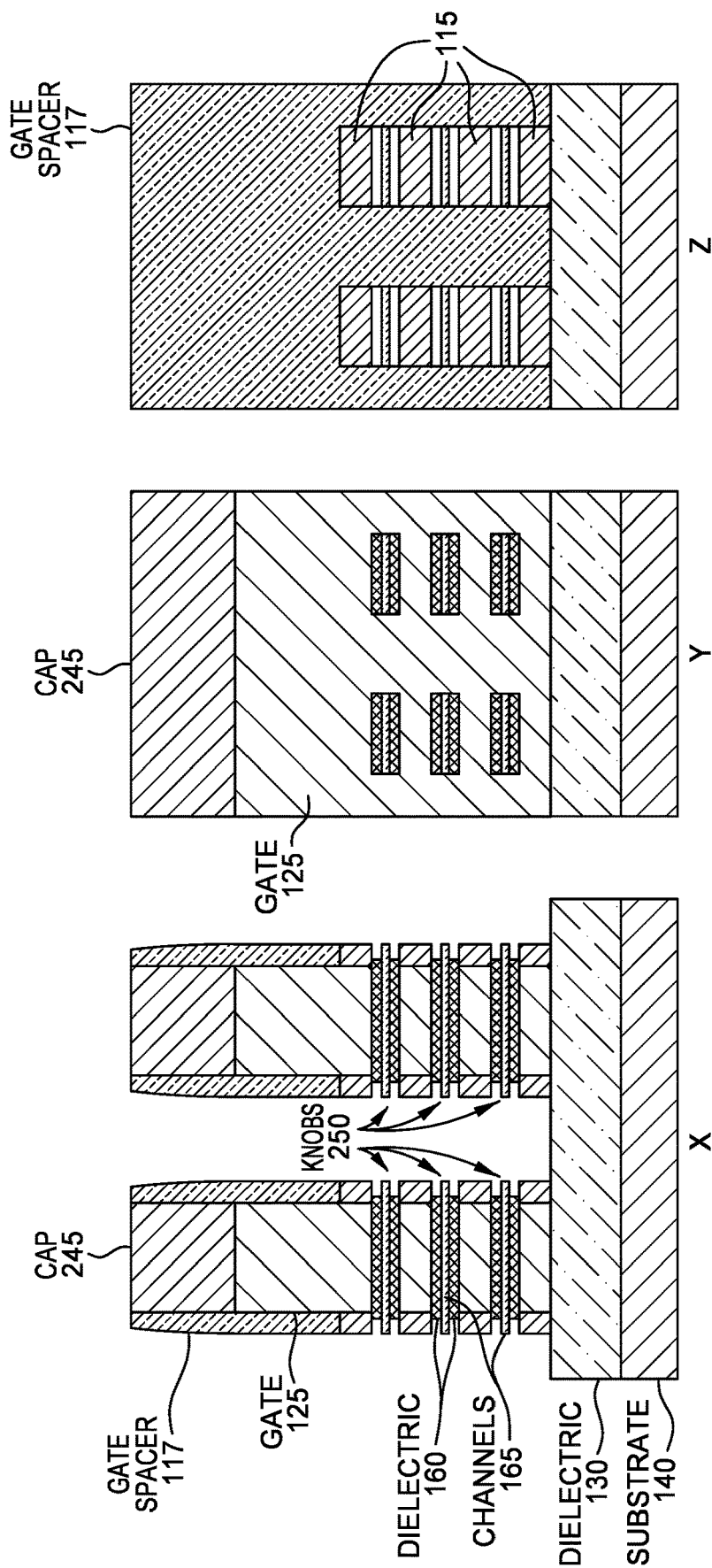

FIG. 2I illustrates performing a selective etch of the dielectric layers 160 (i.e., the gate dielectric). This etch can be timed or be a precision etch so that the sides of the dielectric layers 160 are now recessed so they uncover a portion of the channels 165 (e.g., the widths of the dielectric layers 160 should be wider than the gate 125). If the layers 160 are etched too much, this can cause a short between the gate 125 and the S/D regions once the metal liner is deposited in later steps.

Recessing the dielectric layers 160 results in knobs 250 formed by the ends of the channels 165 protruding out from the dielectric layers 160. Referring to FIG. 1, these knobs 250 can form the male portions 170 of the female/male connections 150. In one embodiment, these knobs 250 have a length of 1-10 nm.

In one embodiment, the knobs 250 of the channel 165 are doped. That is, the knobs 250 are doped differently from a middle portion of the channel 165 (which may not be doped) that is covered by the dielectric layers 160. In one embodiment, the knobs 250 are doped using a non-destructive isotropic process such as plasma doping since implantation may not be suitable for some 2D materials (assuming those materials are used for the channels 165).

Figure 2J:
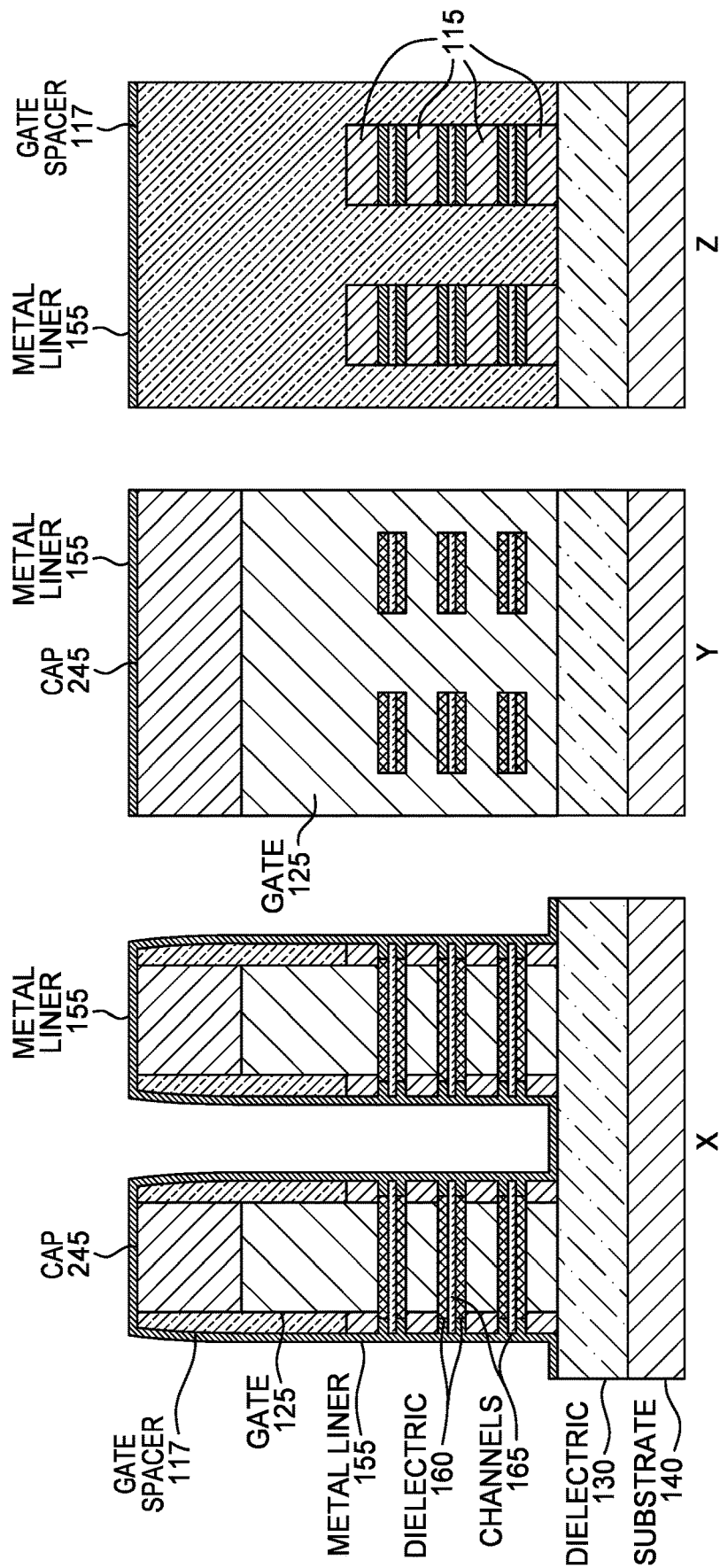

FIG. 2J illustrates conformally depositing the metal liner 155 on the structure in FIG. 2I. While the Y axis view in FIG. 2J illustrates the sides of the channels 165 directly contacting the gate 125, to prevent a short the gate 125 can include a thin gate dielectric to cover the sides of the channels 165 before depositing the metal As shown, the metal liner 155 fills in the space between the knobs 250 of the channels 165 and the spacer 115. Referring to FIG. 1, the metal liner 155 can be the female portion 175 of the female/male connection 150. In one embodiment, for each knob 250, the metal liner 155 contacts its top side, bottom side, and end side, which is either the left end of the channel 165, or the right end of the channel 165 depending on which side the knob 250 is located. Thus, the metal liner 155 can surround all but one end of the knobs 250. As mentioned above, this female/male connection between the knobs 250 of the channels 165 and the metal liner 155 creates an improved electrical connection relative to attempting to deposit the metal liner 155 on the ends of the channel 165 (without recessing the dielectric layers 160).

Although not shown in the figures, additional process steps can performed on the structure in FIG. 2J to result in the FETs 100 illustrated in FIG. 1. That is, the metal liner 155 can be etched to have the shape shown in FIG. 1. Further, the S/D metal 120, contacts 105, and ILD 110 can be formed.

Figure 3:
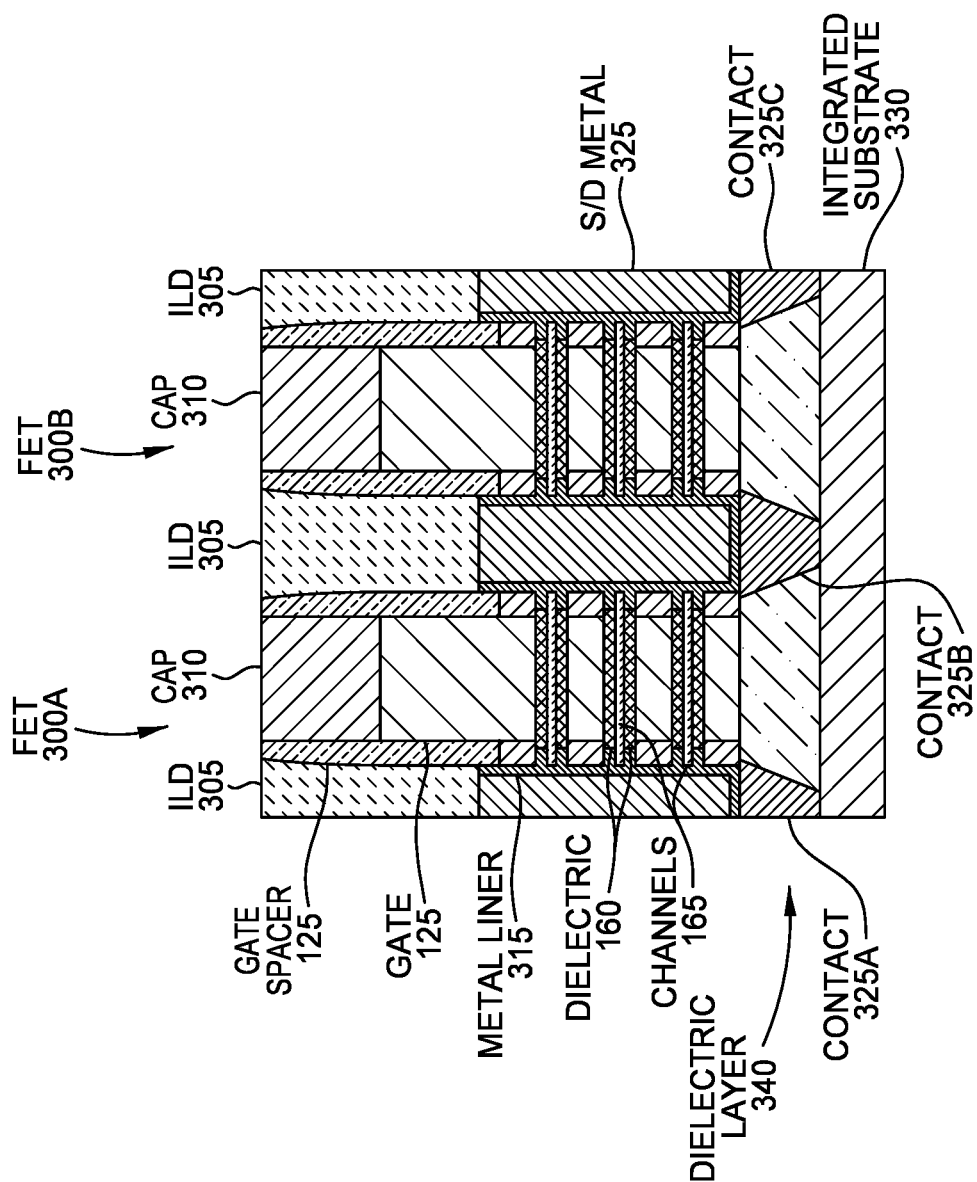
FIG. 3 illustrates h-GAA FETs with female/male connections between channel and metal liners, according to one embodiment.

FIG. 3 illustrates h-GAA FETs 300A and 300B with female/male connections between channel and metal liners, according to one embodiment. The FETs 300 in FIG. 3 are similar to the FETs 100 in FIG. 1 except the FETs 300 have contacts 325 for connecting to S/D metal 320 at the bottom of the structure rather than at the top. That is, the top of the FETs 300 have ILD 305 rather than electrical contacts. To connect the channels 165, metal liner 315, and S/D 320 to S/D regions, an underlying dielectric layer 340 is processed to include the contacts 325. This may occur before the FETs 300 are formed.

Further, a underlying integrated structure 330 on which the FETs 300A and 300B are formed can include additional metal layers (not shown) that electrical connect to the contacts 325. Nonetheless, FIG. 3 illustrates that the same female/male connections (or wrap around connections) can be used between the channels 165 and the metal liner 315 even though the contacts are at the bottom rather than the top of the FETs.

Figure 4:
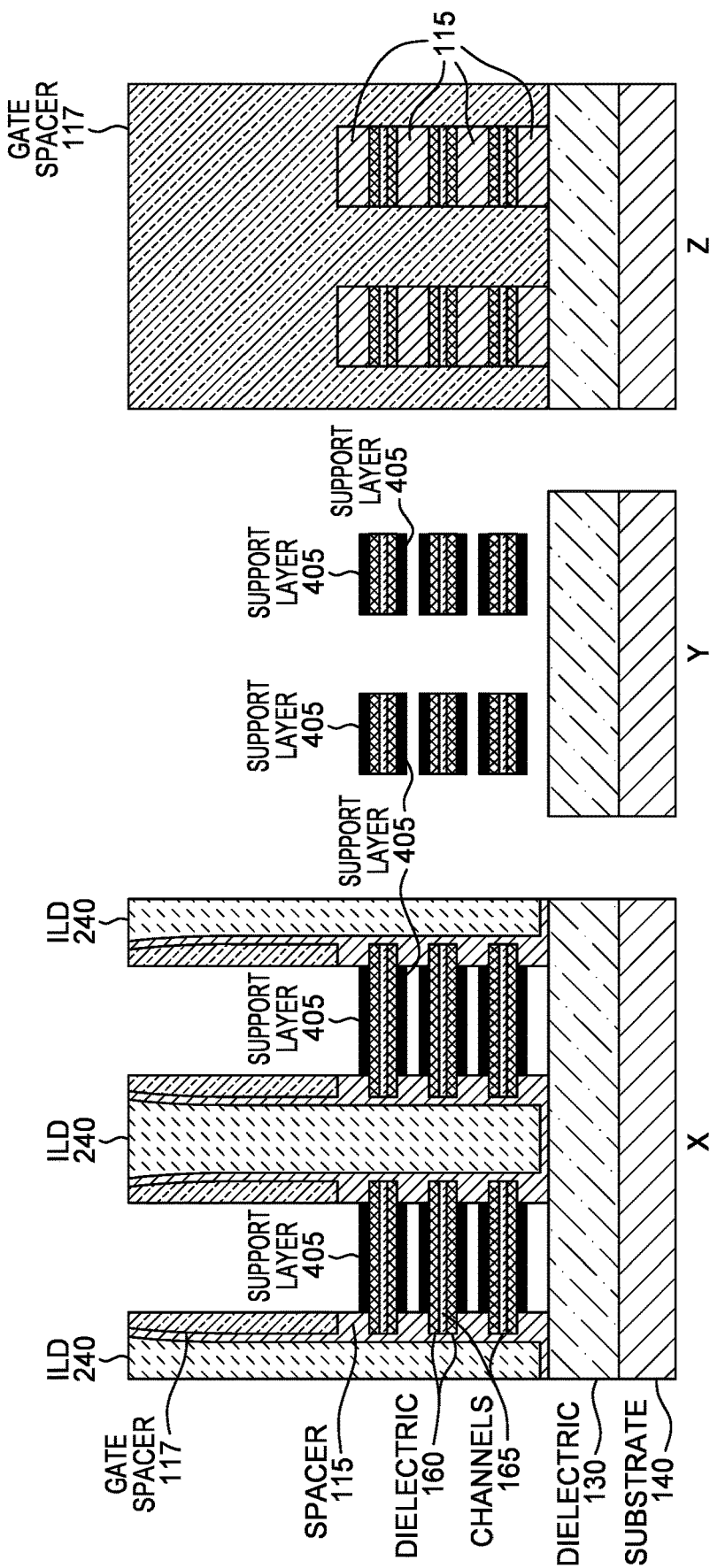
FIG. 4 illustrates additional support layers for the channels, according to one embodiment.

FIG. 4 illustrates additional support layers for the channels, according to one embodiment. As discussed in FIG. 2G, the dielectric layers 160 can support the channels 165 to prevent bending or a rupture when removing the sacrificial gate 220, dummy gate dielectric 225, and the sacrificial layers 210. To provide additional support, FIG. 4 includes support layers 405 that are deposited above and below each pair of dielectric layers 160. These support layers 405 can include TiN and can have a thickness of 0.5-5 nm or 1-1.5 nm. The support layers 405 are also sacrificial layers that can be used to help protect and provide mechanical support to the channels 165 when removing the sacrificial layers 210.

The support layers 405 can be deposited at the same time as when the sacrificial layers 210, dielectric layers 160, and the channels 165 are formed on the dielectric layer 130. Further, the support layers 405 can be removed using a selective etch before depositing the gate 125. Thus, the resulting structure can then follow the process steps discussed above to result in the FETs shown in FIG. 1 or FIG. 3.

Figure 5:
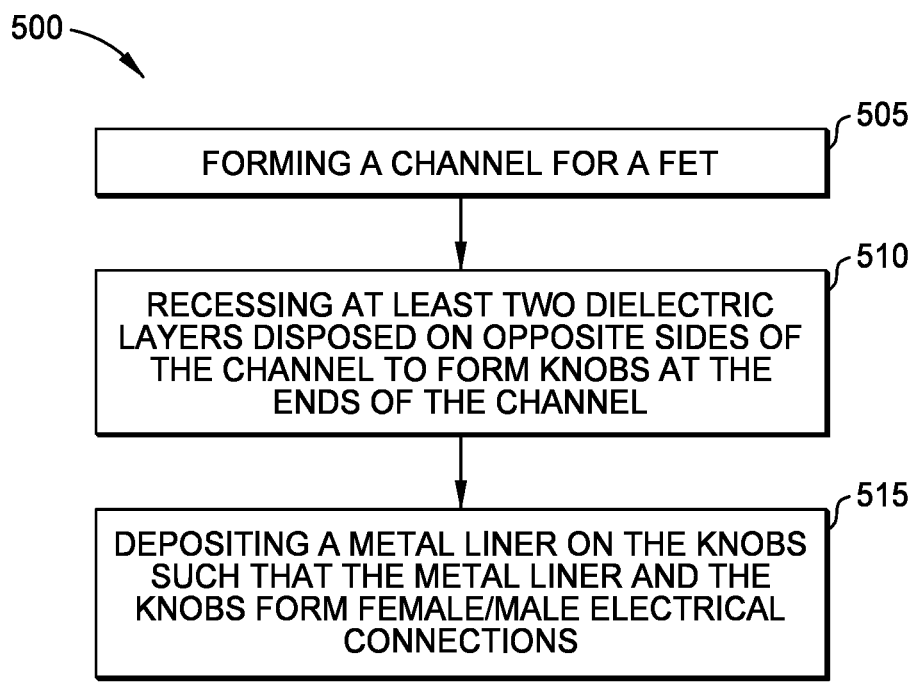
FIG. 5 is a flowchart for forming h-GAA FETs with female/male connections between channel and metal liners, according to embodiments.

FIG. 5 is a flowchart of a method 500 for forming h-GAA FETs with female/male connections between channel and metal liners, according to embodiments. At block 505, a channel for a FET is formed. The FET can include only one channel, or can include multiple channels as shown in the figures above. In one embodiment, the channel is part of horizontal-transport device.

At block 510, at least two dielectric layers disposed on opposite side of the channel are recessed to form knobs at the ends of the channel. An example of this is shown is FIG. 2I where recessing the dielectric layers 160 forms the knobs 250 at the ends of the channels 165.

At block 515, a metal liner is deposited on the knobs such that the metal liner and the knobs form female/male electrical connections. An example of this is shown is FIG. 2J where the metal liner 155 forms female portions that contact the knobs 250 (i.e., the male portions). A close up of the female/male electrical connection is shown in the connection 150 in FIG. 1.

In another embodiment, the method 500 can be modified so that the channel includes female portions at its ends that define cavities in which the metal liner is deposited to form male portions of the female/male electrical connections.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A field-effect transistor (FET) comprising:
    a channel;
    a gate separated from the channel by at least one dielectric layer, wherein the dielectric layer has a smaller width than the channel such that ends of the channel form knobs that extend width-wise further than ends of the dielectric layer, wherein the knobs of the channel are doped differently from a middle portion of the channel; and
    a conductive liner comprising female portions that contact the knobs of the channel, wherein the knobs are male portions that form female/male electrical connections with the female portions of the conductive liner.

2. The FET of claim 1, wherein the female portions of the conductive liner wrap around the knobs of the channel.

3. The FET of claim 1, wherein the gate is disposed on opposite sides of the channel and separated from the channel by at least two dielectric layers disposed on the opposite sides of the channel, wherein both of the at least two dielectric layers have smaller widths than the channel to form the knobs, and wherein the female portions of the conductive liner contact both of the opposite sides of the channel.

4. The FET of claim 1, further comprising:
    a plurality of stacked channels, wherein the channel is one of the plurality of stacked channels, and wherein the gate is disposed on opposite sides of each of the plurality of stacked channels, wherein each of the plurality of stacked channels includes respective knobs forming respective female/male connections with the conductive liner.

5. The FET of claim 1, wherein a thickness of the channel is less than 5 nm.

6. The FET of claim 5, wherein the channel comprises at least one of MoS2, MoSe2, MoTe2, HfS2, ZrS2, WS2, WSe2, SnS, hexagonal boron nitride h-BN, an oxide-semiconductor, Graphene, or carbon nanotubes.

7. A field-effect transistor (FET) comprising:
    a plurality of stacked channels;
    a gate disposed on multiple sides of each of the plurality of stacked channels; and
    a conductive liner, wherein the conductive liner forms female/male connections with ends of each of the plurality of stacked channels, wherein the ends of each of the plurality of stacked channels are doped differently from a middle portion of each of the plurality of stacked channels.

8. The FET of claim 7, wherein the conductive liner comprises males portions that contact female portions of the plurality of stacked channels.

9. The FET of claim 7, wherein the conductive liner comprises female portions that contact male portions of the plurality of stacked channels.

10. The FET of claim 9, further comprising:
    dielectric layers that separate the plurality of stacked channels from the gate, wherein ends of the dielectric layers are recessed relative to the ends of each of the plurality of stacked channels such that the ends of each of the plurality of stacked channels form the male portions.

11. The FET of claim 9, wherein the female portions of the conductive liner wrap around the male portions of the plurality of stacked channels.

12. The FET of claim 7, wherein a thickness of each of the plurality of stacked channels is less than 5 nm.

13. The FET of claim 12, wherein each of the plurality of stacked channels comprises at least one of MoS2, MoSe2, MoTe2, HfS2, ZrS2, WS2, WSe2, SnS, hexagonal boron nitride h-BN, an oxide-semiconductor, Graphene, or carbon nanotubes.

14. A method, comprising:
    forming a channel for a FET;

removing sacrificial layers disposed on opposite sides of the channel;

depositing a gate in the FET in voids left by removing the sacrificial layers;

after depositing the gate in the FET, recessing at least two dielectric layers disposed on the opposite sides of the channel to form knobs at ends of the channel; and depositing a conductive liner on the knobs such that the conductive liner and the knobs form female/male electrical connections.

15. The method of claim 14, further comprising:

forming, before removing the sacrificial layers, support layers on the opposite sides of the channel, the support layers arranged between the at least two dielectric layers and the sacrificial layers; and removing the support layers after removing the sacrificial layers but before depositing the gate.

16. The method of claim 10, wherein a thickness of the channel is less than 5 nm.

17. The method of claim 16, wherein the channel comprises at least one of MoS2, MoSe2, MoTe2, HfS2, ZrS2, WS2, WSe2, SnS, hexagonal boron nitride h-BN, an oxide-semiconductor, Graphene, or carbon nanotubes.

* * * * *